United States Patent [19]

Tolmie, Jr.

[11] 4,311,956
[45] Jan. 19, 1982

[54] ZERO CROSSING PHASE FIRED CONTROLLER

[75] Inventor: Robert J. Tolmie, Jr., Brookfield, Conn.

[73] Assignee: Pitney Bowes Inc., Stamford, Conn.

[21] Appl. No.: 161,095

[22] Filed: Jun. 19, 1980

[51] Int. Cl.³ ............................................. G05F 5/00
[52] U.S. Cl. .................... 323/300; 323/326; 323/902
[58] Field of Search ............... 323/300, 319, 324, 326, 323/902, 242, 243; 307/252 T, 252 UA

[56] References Cited

U.S. PATENT DOCUMENTS 3,621,373 11/1971 Mitchell et al. ..................... 323/243
3,821,634 6/1974 Sabolic ........................ 307/252 UA
3,932,770 1/1976 Fantozzi ...................... 307/252 UA Primary Examiner—William M. Shoop
Assistant Examiner—Peter S. Wong
Attorney, Agent, or Firm—Peter Vrahotes; William D. Soltow, Jr.; Albert W. Scribner

[57] ABSTRACT

A phase fired controller is provided for eliminating large shifts in the firing angle due to line voltage variations. Another advantage of the controller is that variations resulting from parts tolerances are reduced substantially. This is accomplished by controlling the output of a capacitor that supplies a voltage to a comparator. The system has particular utility when used as a dimmer controller of an electrostatic copier.

9 Claims, 6 Drawing Figures

ZERO CROSSING PHASE FIRED CONTROLLER

BACKGROUND OF THE INVENTION

Difficulties are often encountered in electrical circuits because of the variation in line voltage and errors due to the tolerance levels of the various components. This is particularly true in phase fired control circuits when there are large line voltage variations and many components involved. Variations caused by these factors lead to large shifts in the firing angle of the control circuit. Additionally, the setting of a control resistor can present problems if setting of the optimum operating point is required at nominal line voltage at the center of the variable control resistor travel.

SUMMARY OF THE INVENTION

A phase fired control system is provided which includes a clamping and zero crossing detector circuit that controls the charging and discharging of a capacitor. The capacitor is discharged when a low signal is detected by the zero crossing detector and charged when a high signal is detected. A comparator receives the output voltage from the capacitor and a variable standard voltage, compares the two and sends a signal to an inverting driver in response thereto. The inverting driver enables a light emitting diode that controls a gate triac that in turn controls a load triac for serving a given function.

DETAILED DESCRIPTION OF THE PREFERRED EMBODIMENT

Figure 1:
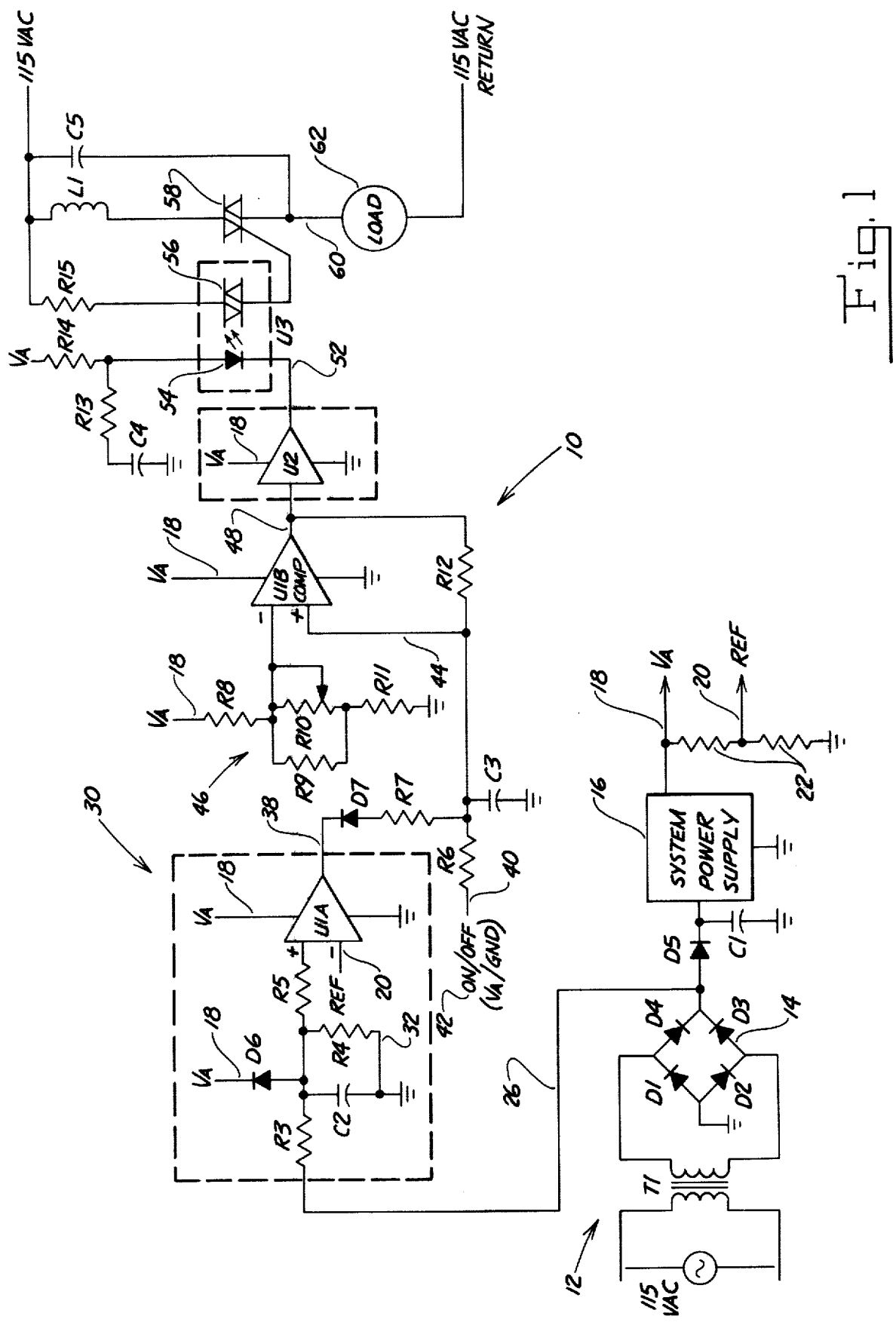
FIG. 1 shows a circuit of a phase fired controller that incorporates the instant invention.

A control system is generally shown at 10 in FIG. 1 and includes a source of power 12 such as a conventional 110 volt line circuit that is in connection with a transformer T1. The output end of the transformer T1 is in connection with a grounded bridge having four diodes D1, D2, D3 and D4 and which acts as a power supply RECTIFIER. Another diode D5 receives the output signal from the bridge 14 and blocks d.c. voltage from the power supply filter. A power supply 16 supplies a fixed voltage level VA, such a twelve volts, through a lead 18 to the balance of the circuit where required and also supplies a reference signal REF through a lead 20. The leads 18, 20 are grounded through a pair of resistors 22. A grounded capacitor C1 is located between the diode D5 and the system power supply 16. This combination filters the output from the diode D5.

Figure 2A:
FIGS. 2a-2e show voltage wave forms at various locations within the circuit shown in FIG. 1.
Figure 2B:

A lead 26 is connected to the output of the bridge 14 and a clamping and zero crossing detector circuit 30 which includes a pair of resistors R3 and R5. The voltage on this lead 26 will have the wave form shown in FIG. 2a. A grounded comparator U1-A receives a signal from the clamping and detection circuit 30 having the wave form shown in FIG. 2b and also receives the reference signal REF from the lead 20 and the fixed voltage VA from the lead 18. A grounded RC circuit 32 is connected between the two resistors R3, R5 and includes a capacitor C2 and a resistor R4. This RC circuit is used to filter the control signal supplied to the positive terminal of the U1-A comparator. The fixed voltage VA is also supplied to the lead 26 intermediate the resistors R3, R5, there being a diode D6 on the lead 18 intermediate the resistors R3, R5. The voltage output of the comparator U1-A is carried by a lead 38 and will have the wave form shown in FIG. 2c. The output lead 38 of the comparator U1-A is coupled to another lead 40 through a diode D7 and protective resistor R7. The lead 40 is connected to an on/off switch 42. A resistor R6 is included in the lead 40 between the on/off switch 42 and the connection with the output lead 38. A grounded capacitor C3 is connected to the lead 40. The lead 40 is coupled through another lead 44 to a comparator U1-B, the lead 44 serving as the positive input for the comparator U1-B. A variable input voltage is supplied to the negative input of the comparator U1-B through a circuit generally shown at 46, and consists of resistors R8, R9, R10, and R11, the resistor R10 being a variable control resistor serving to control voltage inputted to the voltage comparator U1-B. The voltage supplied by the lead 18 through the resistor R8 sets the maximum power that can be supplied. The comparator U1-B also receives the fixed voltage VA and has a connection with ground. A resistor R12 is on the lead 40 downstream from the junction with the lead 44 and is connected to the output lead 48 of the comparator U1-B. An inverting driver U2 receives the output 48 of the U1-B comparator, the inverting driver also being connected to the fixed voltage VA and to ground. The output lead 52 of the inverting driver U2 is coupled to a light emitting diode 54 whose anode is connected to a circuit that includes a resistors R13 and R14 and a capacitor C4 and the fixed voltage VA through a resistor R14. A gate triac 56 is coupled to the LED 54. The gate triac 56 is connected to a load triac 58 which has an output lead 60 that is connected to the lead 62. The load TRIAC 58 is also coupled to an induction coil L1 which is in parallel with a capacitor C5 to act as a suppressor to slow down the rate of rise of the current supplied to the lead 62.

In operation, the clamping and zero crossing detection circuit 30 discharges the capacitor C3 every cycle that is used to generate the firing angle delay. The comparator U1-B then compares the capacitor C3 charging voltage to the set voltage received from the circuit 46. The output of the comparator U1-B goes to the inverting driver U2 that is used to drive the LED 54 which will enable the optically coupled gate triac 56. The optically coupled gate triac 56 will enable the load triac 58 thereby supplying an RMS voltage to the load 62.

Figure 2C:

The transformer T1 and diodes D1-D4 are included for continuity. The diode D5 blocks DC from the system power supply 16 to the lead 26. The voltage at the anode of the diode D5 will look like the wave form of FIG. 2a. The wave form of voltage at the output of comparator U1-A is shown in FIG. 2c, the output being low when the sine wave input at the positive comparator input is less than the reference voltage at the reference input 20. The resistors R3, R4 divide off a portion of the sine input so that the output of the comparator is low for about 1 ms after zero crossing on the sixty cycle sign wave with a total period of 8.33 ms. The diode D6 assures that the maximum voltage supplied to the comparator U1-A is only slightly greater than the fixed voltage VA, as for example, 0.7 volts greater than the fixed voltage. In this way, the magnitude of the voltage supplied by the circuit 30 may be controlled to a selected maximum.

Figure 2D:
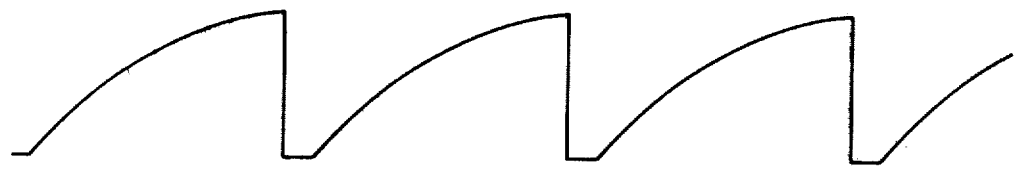

The low output on the comparator U1-A discharges the capacitor C3 when the on/off switch 42 is on. The capacitor C3 is kept discharged until the output of the comparator U1-A goes high through the diode D7 and resistor R7. After the output of the comparator U1-A goes high, the capacitor C3 starts to charge through resistor R6 at a time constant equal to C3(R6×R12)/(R6+R12) maximum value equal to (R12×VA)/(R12+R6). The resistor R12 also sets the compare point hysteresis. The wave form at the output of capacitor C3 is shown in FIG. 2d. The output of the comparator U1-B goes high when the voltage on the capacitor C3 equal the value of voltage from the circuit 46 at the minus input of the comparator U1-B. This voltage is set by the resistors R8–R11, and is adjustable through varying the resistor R10. The minimum voltage at this point is set by the resistors R8 and R11 to a value greater than the highest value to which the capacitor C3 will be discharged plus an amount that will increase the turn on angle to the minimum desired. The maximum voltage is set by the resistors R8–R11 and is set for the maximum turn on angle desired. The resistor R9 is used to the set the center travel of the variable resistor R10 equal to the center turn on angle required to obtain the RMS voltage required. The inverting driver U2 goes low when the output of the comparator U1-B goes high and discharges the capacitor C4 through resistor R13 and the LED 54. The resistor R14 also supplies some current through the LED 54. The resistor R14 could supply all the current if 15 ma of current is available.

Figure 2E:
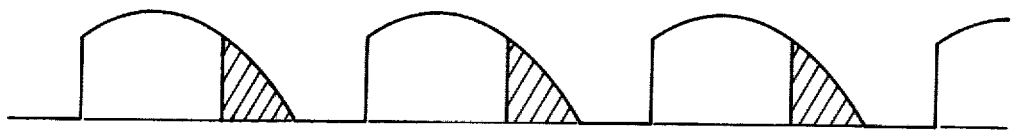

The gate triac 56 will turn on and conduct current through the resistor R15 into the load triac 58 which supplies an RMS voltage to the load 62 that is variable from a large to a small portion of the total RMS voltage available, as shown in FIG. 2e. The shaded portion of FIG. 2e represents the minimum RMS voltage that will be available with R10 set at maximum resistance. It will be appreciated that the load 62 may be a lamp dimmer of an electrostatic copier.

The lamp dimmers that are presently in use have some problems that the control system 10 will solve. These problems include sensitivity of the setting variable resistor, usable range of the setting variable resistor, component tolerance variations, line voltage variations, on/off control, and voltage isolation. The setting of the control resistor in a dimmer can present problems if setting of the optimum operating point is required at nominal line voltage at the center of variable control resistor travel. The tolerance of the parts makes this difficult to accomplish. The values and ratings on the parts cannot be made tight enough without excessive cost, and even then some parts cannot be held to the tolerance required.

The prior systems also start charging from the time of zero crossing and a fixed resistance or part of the variable resistor must be used to set the minimum angle. The RMS voltage does not drop linearly. As the time increases from zero, the RMS voltage has dropped less than 1.5% at 16.67% of total cycle time. The controller system 10 can set this value much more accurately because of part tolerances without using a part of the variable resistor, so that the useful range of the potential is increased.

The loss of variations due to part tolerance, line voltage and minimum angle reduce the amount of the potential used to compensate for such loss and increases the effective potential range without making it too sensitive.

What is claimed is:

1. A phase fired control circuit for eliminating large shifts in the firing angle, comprising: a power supply operational to provide a fixed voltage and a reference voltage, a clamping and zero crossing detector circuit, means for supplying d.c. to said clamping and detector circuit, a capacitor operative to be charged by said fixed voltage, said capacitor being charged when said detector circuit outputs a first voltage and discharged when said detector circuit outputs a second voltage, a variable voltage circuit, said variable voltage circuit receiving said fixed voltage, a comparator connected to receive the output from said capacitor when said capacitor is discharged and the output from said variable voltage circuit, said comparator being operative to compare said outputs and send a high signal when the magnitude of said capacitor output is higher than the output from said variable voltage circuit, and an inverting driver operative to receive the signal from said comparator, a gate coupled to said comparator to be driven thereby, a source of power controlled by said gate and a load in electrical connection with said source of power to be driven thereby when said gate is enabled.

2. A phase fired control system for eliminating large shifts in the firing angle, comprising: a power supply operational to provide a fixed voltage and a reference voltage, a clamping and zero crossing detector means, means for supplying d.c. current to said detector means, a first capacitor operative to be charged by said fixed voltage, said capacitor being charged when the output of said detector means is greater than a given value and discharged when said zero crossing detector means output is below said given value, a variable resistor circuit, said fixed voltage being supplied to said variable resistor circuit, a comparator connected to receive the output from said capacitor when said capacitor is discharged and the output from said variable resistor circuit, said comparator being operative to compare said outputs and drive a load when said capacitor output is greater than said variable resistor circuit output.

3. The control system of claim 2 including inverter means coupled to the output of said comparator, light emitting means operative to be enabled by said inverter means, gate means optically coupled to said light emitting means to be enabled thereby, and load enabling means electrically connected to said gate means and to said load.

4. The control system of claim 3 wherein said clamping and zero crossing detector means includes a lead having a pair of resistors in series with one another, said lead being in electrical connection with said d.c. supply means, a diode connected to the junction between said rsistors and to said fixed voltage, a second comparator having a first terminal for receiving the output from said lead and a second terminal for receiving said reference voltage, said second comparator being grounded and in electrical connection with said fixed voltage, said second comparator being operative to compare the inputs at its terminals and send a high signal when the input from said detector means is greater than the input from the reference voltage and a low signal when the input from said detector means is less than the input from the reference voltage.

5. A zero crossing phased fired control system for eliminating large shifts in the firing angle, comprising: means for supplying a voltage, clamping and zero crossing detection means for providing a controlled voltage, said detection means being coupled to said means for supplying a voltage to receive a supplied voltage therefrom, means for supplying a reference voltage and fixed voltage, first comparator means for receiving said controlled voltage and said reference voltage and comparing the values of these two voltages, said first comparator means outputing a high signal when said controlled voltage is greater than said reference voltage and sending out a low signal when said reference voltage is higher in value than said controlled voltage, a capacitor coupled to said fixed voltage and to the output of said first comparator means, said capacitor being charged by said fixed voltage when said first comparator means output is high and discharged when said first comparator means output is low, second comparator means, said capacitor means being coupled to a terminal of said second comparator means, variable voltage circuit means operative to output a voltage to a second terminal of said second comparator means, said second comparator means being operative to compare the value of the voltages at its two terminals and output a high signal when said capacitor means voltage is greater than said variable voltage circuit means output, and means coupled to said second comparator means output to drive a load when said second comparator means output is high.

6. The control system of claim 5, wherein said clamping and zero crossing detection means includes means for clamping the supplied voltage to said comparator to a selected maximum magnitude and means for driving off a portion of the sine wave from said voltage supply.

7. The control system of claim 6 wherein said means for supplying said supplied voltage includes a source of alternating current and means for rectifying the alternating current to direct current.

8. The control system of claim 6 wherein said means for driving a load includes an LED connected to the output of said second comparator, a gate triac optically coupled to said LED and a load triac electrically connected to said gate triac, said load triac being operatively connected to said load.

9. The control system of claim 7 wherein said load is a light dimmer for an electrostatic copier.

* * * * *